United States Patent [19]

Yamashita et al.

[11] Patent Number: 5,726,493
[45] Date of Patent: Mar. 10, 1998

[54] SEMICONDUCTOR DEVICE AND SEMICONDUCTOR DEVICE UNIT HAVING BALL-GRID-ARRAY TYPE PACKAGE STRUCTURE

[75] Inventors: Taturou Yamashita, Kagoshima; Masashi Takenaka, Kawasaki, both of Japan

[73] Assignee: Fujitsu Limited, Kawasaki, Japan

[21] Appl. No.: 805,317

[22] Filed: Feb. 24, 1997

Related U.S. Application Data

[63] Continuation of Ser. No. 489,932, Jun. 13, 1995, abandoned.

[30] Foreign Application Priority Data

Jun. 13, 1994 [JP] Japan .................................. 6-130620

[51] Int. Cl.⁶ .......................... H01L 23/02; H01L 29/40; H01L 23/52
[52] U.S. Cl. .......................... 257/698; 257/686; 257/738; 257/717; 257/720; 257/692; 257/777; 257/697
[58] Field of Search .......................... 257/696, 692, 257/697, 694, 698, 717, 720, 738, 734, 735, 737, 675, 686, 777

[56] References Cited

U.S. PATENT DOCUMENTS

| | | | |
|---|---|---|---|
| 5,006,922 | 4/1991 | McShane et al. | 257/697 |
| 5,102,829 | 4/1992 | Cohn | 257/697 |
| 5,172,303 | 12/1992 | Bernardoni et al. | 257/693 |
| 5,200,366 | 4/1993 | Yamada et al. | 257/647 |
| 5,291,062 | 3/1994 | Higgins, III | 257/698 |
| 5,334,857 | 8/1994 | Mennitt et al. | 257/737 |
| 5,433,822 | 7/1995 | Mimura et al. | 257/737 |
| 5,455,456 | 10/1995 | Newman | 257/738 |
| 5,468,999 | 11/1995 | Lin et al. | 257/738 |
| 5,608,265 | 3/1997 | Kitano et al. | 257/737 |

FOREIGN PATENT DOCUMENTS

| | | | |
|---|---|---|---|
| 61-51948 | 3/1986 | Japan | 257/698 |
| 63-300541 | 12/1988 | Japan | 257/698 |
| 63-301552 | 12/1988 | Japan | 257/698 |
| 4-177862 | 6/1992 | Japan | 257/697 |
| 5-29533 | 2/1993 | Japan | 257/723 |

*Primary Examiner*—Tom Thomas
*Assistant Examiner*—Alexander Oscar Williams
*Attorney, Agent, or Firm*—Armstrong, Westerman, Hattori, McLeland & Naughton

[57] ABSTRACT

A semiconductor device or a semiconductor device unit having a ball-grid-array type package structure, comprises a semiconductor element, a base having a mounting surface and a connection surface opposite to each other, the semiconductor element being mounted on the mounting surface, a plurality of balls which function as external connection terminals being provided on the connection surface, a sealing resin sealing the semiconductor element, and an electrically conductive electrode member, a first end of the electrode member being electrically connected to the semiconductor element on the mounting surface of the base, a second end of the electrode member being electrically connective to an outer terminal. An electrically conductive pin which can pass through the sealing resin can be used as the electrode member. Even after the semiconductor device is mounted on a circuit board, a test on the semiconductor element can be conducted. Also, a reliability of electric appliances and a heat release efficiency can be improved.

9 Claims, 7 Drawing Sheets

SEMICONDUCTOR DEVICE AND SEMICONDUCTOR DEVICE UNIT HAVING BALL-GRID-ARRAY TYPE PACKAGE STRUCTURE

This application is a continuation of application Ser. No. 08/489,932 filed Jun. 13, 1995, now abandoned.

BACKGROUND OF THE INVENTION

1. Field of the Invention

The present invention generally relates to semiconductor devices and semiconductor device units, and more particularly to a semiconductor devices and a semiconductor device units having a package structure of a BGA (Ball Grid Array) type.

2. Description of the Prior Art

A demand for a semiconductor device having a low-cost package structure which can cope with high integration and be used for high power, is increasing these days. In order to respond to the demand, a BGA-type package structure has been developed and spotlighted. Semiconductor devices having such a structure are used in various electric appliances, such as cordless telephones and personal computers.

Figure 1:
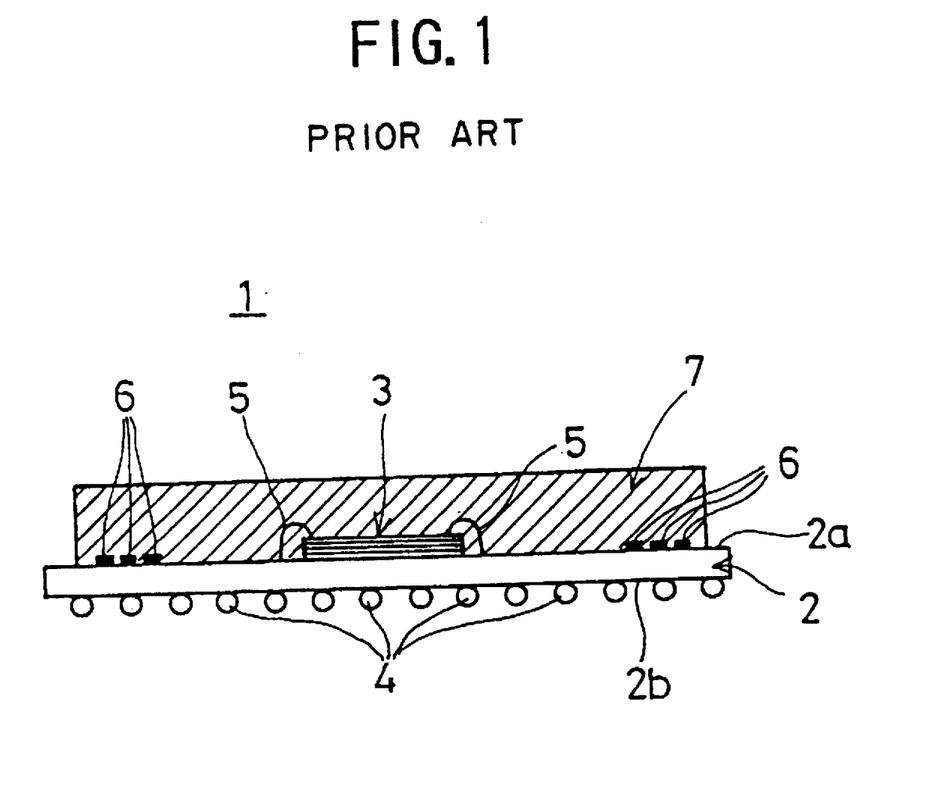
FIG. 1 is a sectional view showing an example of a conventional-type semiconductor device.

FIG. 1 shows a conventional semiconductor device 1 having a plastic BGA (hereinafter, referred to as PBGA) type package structure. In FIG. 1, the semiconductor device 1 has a printed base 2 of a multilayer structure. The upper surface of the printed base 2 is a mounting surface 2a, on which a semiconductor element 3 is secured through die bonding. The opposite surface of the mounting surface 2a of the printed base is a package surface 2b, on which a plurality of solder balls 4 are provided. These solder balls 4 function as outer package terminals. On the mounting surface 2a or multi-layered inner layers of the printed base 2, a prescribed electrode pattern (not shown) is printed. Between the electrode pattern formed on the mounting surface 2a and the semiconductor element 3, wires 5 are provided to connect the electrode pattern and the semiconductor element 3 electrically. A plurality of through holes 6 are formed on the printed base 2. Through the through holes 6, the electrode pattern electrically connected to the semiconductor element 3 is introduced to the mounting surface 2b of the printed base 2 and is electrically connected to the solder balls 4. On the mounting surface 2a of the printed base 2, a sealing resin 7 is formed to protect the semiconductor element 3. The semiconductor element 3 is buried in the sealing resin 7.

By using the PBGA structure in the semiconductor device 1, if the number of lead wires is increased with a high integration of the semiconductor element 3, a strength of the lead wires is not lowered and a secure connection can be realized, compared to a semiconductor having a QFP (Quad Flat Package) structure.

However, in the conventional semiconductor device 1 with the PBGA structure, as the semiconductor element 3 is buried in the sealing resin 7, a test cannot be conducted on the semiconductor element 3 after the semiconductor device 1 is mounted on a circuit board or the like. Accordingly, a reliability (yield) of electric appliances in which the semiconductor device 1 is used may possibly be lowered.

These days, a plurality of semiconductor devices are stacked to improve a package density of the semiconductor device unit. However, in the conventional PBGA structure, since a plurality of semiconductor devices 1 cannot be stacked, it is impossible to improve the package density using stacking.

Moreover, in the conventional semiconductor device 1 with the PBGA structure, since the semiconductor element 3 is simply buried in the sealing resin 7, a release efficiency of a heat generated by the semiconductor element 3 is low.

SUMMARY OF THE INVENTION

Accordingly, it is a general object of the present invention to provide a novel and useful semiconductor device and a semiconductor device unit in which the demand described above is satisfied.

A more specific object of the present invention is to provide a semiconductor device and a semiconductor device unit in which a test can be conducted even after a production thereof, and a reliability and a heat release efficiency thereof can be improved.

The above object of the present invention is achieved by a semiconductor device comprising a semiconductor element, a base having a mounting surface and a connection surface opposite to each other, the semiconductor element being mounted on the mounting surface, a plurality of balls which function as external connection terminals being provided on the connection surface, a sealing resin sealing the semiconductor element, the sealing resin being formed on the mounting surface of the base, and an electrode member having a first end and a second end, the first end of the electrode member being electrically connected to the semiconductor element on the mounting surface of the base, the second end of the electrode member being electrically connective to an outer terminal.

According to the above invention, in the PBGA type semiconductor device, in which the semiconductor element sealed by the sealing resin is mounted on the mounting surface of the base and the plurality of balls are provided on the connection surface, a electrode member of which the first end is electrically connected to the semiconductor element and the second end thereof can be electrically connected to the outer terminal. Accordingly, an electrical connection between the semiconductor element and outer terminal is available through the electrode member. Therefore, even after the semiconductor device is secured on a circuit board, the semiconductor can be tested by using the electrode member.

In the above invention, the electrode member can be an electrically conductive metal pin which passes through the sealing resin. Accordingly, the connection between the semiconductor element and outer terminal is available with a simple structure.

In the above invention, the sealing resin can have a hole formed therein and the second end of the electrode member can be positioned in the hole. According to the invention, as the second end of the electrode member is positioned in the hole formed in the sealing resin, a change in shape of the second end can be prevented when an outer stress is applied. Also, when semiconductor devices are stacked to constitute a semiconductor device unit, the hole can be utilized as a positioning hole.

In the above invention, a second base having an electrode pattern formed thereon can be provided. This second base is buried in the sealing resin and the electrode member is electrically connected to the electrode pattern formed on the second base. In this invention, an increase in an electrode pattern area can be made by using the second base in addition to the base on which the semiconductor device is provided. Also, since it is possible for the second base to have a wider wiring space than the base on which the semiconductor element is provided, inductance characteristics of the electrode pattern provided thereon can be improved.

In the above invention, the second base can have a penetration hole formed therein through which the electrode member passes. Also, the invention can have a connecting portion provided in the penetration hole by which the electrode pattern is electrically connected to the electrode member and by which the second base and the electrode member support each other. Accordingly, since a position of the electrode member is determined by the second base, the electrode member is prevented from being moved by the sealing resin when the sealing resin is molded. Also, as the second base is supported by the electrode member before the molding of the sealing resin, no additional parts are required to support the second base when the sealing resin is molded. Therefore, the molding of the sealing resin can be conducted easily.

In the above invention, a heat release member for releasing heat generated in the semiconductor element can be provided on the upper part of the sealing resin, wherein the heat release member is engaged to the electrode member. Accordingly, heat release characteristics of the heat generated in the semiconductor device can be improved. Also, since the heat release member is supported by the electrode member, the molding of the sealing resin can be conducted easily without using a tool for supporting the heat release member.

In the above invention, the heat release member can have an electrode pattern formed thereon wherein the electrode member is electrically connected to the electrode pattern formed on the heat release member. According to the invention, since the electrode pattern is formed on the heat release member and the electrode member is electrically connected to the electrode pattern, both the heat release characteristics and electric characteristics can be improved.

The above objects of the present invention are also achieved by a semiconductor device unit comprising a plurality of semiconductor devices arranged in a stacked formation, each of the semiconductor devices comprising a semiconductor element, a base having a mounting surface and a connection surface opposite to each other, the semiconductor element being mounted on the mounting surface, a plurality of balls which function as external connection terminals being provided on the connection surface, a sealing resin sealing the semiconductor element, the sealing resin being formed on the mounting surface of the base, and an electrode member having a first end and a second end, the first end of the electrode member being electrically connected to the semiconductor element on the mounting surface of the base, the second end of the electrode member being electrically connective to an outer terminal.

The above objects of the present invention are also achieved by a semiconductor device unit comprising two semiconductor devices arranged in a stacked formation, each of the semiconductor devices comprising, a semiconductor element, a base having a mounting surface and a connection surface opposite to each other, the semiconductor element being mounted on the mounting surface, a plurality of balls which function as external connection terminals being provided on the connection surface, a sealing resin sealing the semiconductor element, the sealing resin being formed on the mounting surface of the base, and an electrode member having a first end and a second end, the electrode member being electrically conductive, the first end of the electrode member being electrically connected to the semiconductor element on the mounting surface of the base, the second end of the electrode member being electrically connective to an outer terminal, wherein the sealing resin has a hole formed therein and the second end of the electrode member is positioned in the hole in one of the semiconductor devices.

According to the above invention, as a plurality of the semiconductor devices are stacked, a package efficiency of the semiconductor device unit can be improved and the unit can be highly integrated.

In the above invention, a plurality of the semiconductor devices can be electrically connected by one of connections, which connections include a connection between the balls and the electrode members, a connection between the balls and a connection between the electrode members. According to the invention, the electrical connection between the upper semiconductor and the bottom semiconductor can be made by the connection between the balls, the connection between the electrode members, or the connection between the balls and electrode members. Therefore, various multilayer structures are available and a freedom for determining the multilayer structure can be improved.

In the above invention, the electrode member formed in one semiconductor device is inserted into a hole formed in the other semiconductor devices whereby the electrode member formed in the one semiconductor device is connected to the electrode member formed in the other semiconductor device. According to the invention, the electrode member formed in the one semiconductor device is inserted into the hole formed in the other semiconductor device to connect each multilayered semiconductor element. Accordingly, when the electrode member formed in the one semiconductor device is inserted into the holes formed in the other semiconductor device, a position of each of the semiconductor devices can be determined. Therefore, a stacking procedure can be conducted easily.

DETAILED DESCRIPTION OF THE EMBODIMENTS

Referring to the drawings, embodiments of the present invention are described in further detail.

Figure 2:
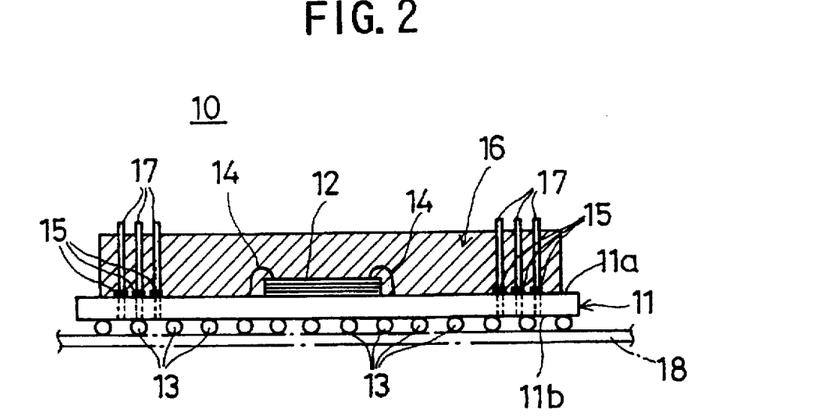
FIG. 2 is a sectional view showing a semiconductor device of a first embodiment of the present invention.

FIG. 2 is a sectional view showing a semiconductor device 10 of a first embodiment of the present invention.

As shown in FIG. 2, the semiconductor device 10 has a printed circuit base 11. On the printed circuit base 11, electrode patterns are formed on both sides or are multilayered. The upper surface of the printed circuit base 11 is a mounting surface 11a on which a semiconductor element 12 is secured through die bonding. The opposite side of the mounting surface 11a of the printed circuit base 11 is a connection surface 11b on which a plurality of solder balls 13 are provided. The solder balls 13 function as external connection terminals.

Between a prescribed electrode pattern (not shown) formed on the mounting surface 11a and the printed circuit base 11, wires 14 are provided to connect the printed circuit base 11 and the semiconductor element 12. The electrical connection between the electrode pattern and the semiconductor element 12 is not limited to a manner using the wires 14, but a flip-chip method or a TAB (Tape Automated Bonding) method can also be used.

In the printed circuit base 11, a plurality of through holes 15 are formed. Through the through holes 15, the electrode pattern electrically connected to the semiconductor element 12 is led to the package surface 11b of the printed circuit base 11. Also, an electrode pattern (not shown) is formed on the package surface 11b of the printed circuit base 11. Solder balls 13 are provided on this electrode pattern. The through holes 15 are connected to the electrode pattern connected to the solder balls 13 on the package surface 11b. Accordingly, the semiconductor element 12 is electrically connected to the solder balls 13 through the electrode pattern formed on the mounting surface 11a, the through holes 15 and the electrode pattern formed on the package surface 11b.

On the mounting surface 11a of the printed circuit base 11, a sealing resin 16 for sealing the semiconductor element 12 from outside is formed to protect the semiconductor element 12. The semiconductor element 12 is buried in the sealing resin 16.

On the mounting surface 11a of the printed circuit base 11, electrode members 17, which are a feature of the present invention, are provided vertically. The electrode members 17 are electrically conductive metal pins and the lower ends thereof are inserted into the through holes 15 formed on the mounting surface 11a of the printed circuit base 11. By this structure, the electrode members 17 are electrically connected to the through holes 15, and are secured on the printed circuit base 11. Also, the electrode members 17, as shown in FIG. 2, vertically pass through the sealing resin 16, and the top ends thereof protrude from the sealing resin 16.

As described above, the through holes 15 are connected to the semiconductor element 12 through the electrode pattern formed on the mounting surface 11a of the printed circuit base 11 and are also connected to the solder balls 13 through the electrode pattern formed on the package surface 11b. Accordingly, when the electrode members 17 are electrically connected to the through holes 15, the electrode members 17 are electrically connected to the semiconductor element 12 and the solder balls 13.

Since the top ends of the electrode members 17 protrude from the sealing resin 16, it is possible for the electrode members 17 to be electrically connected to outer terminals outside of the sealing resin 16. That is, according to the semiconductor device 10 of this embodiment, though the mounting surface 11a of the printed circuit base 11 is covered with the sealing resin 16, the outer terminals can be connected to the semiconductor element 12 and the solder balls through the electrode members 17 protruding from the sealing resin 16.

Therefore, after the semiconductor device 10 is mounted on a circuit board 18 (shown as alternately long and short lines in FIG. 2), a test such as whether the semiconductor element 12 properly functions or whether each solder ball 13 is properly solder-jointed (properly packaged) can be conducted by using the electrode members 17 protruding from the sealing resin 16. Therefore, an accuracy in mounting a semiconductor device 10 on the circuit board 18 and a reliability of electrical appliances on which the semiconductor device 10 is mounted can be improved.

Also, the electrode members 17 can be metallic pin members, which can be produced easily and economically. In order to secure the electrode members 17 on the printed circuit base 11, through holes 15, which are formed even on the conventional printed circuit base are utilized. Accordingly, in order to provide the electrode members 17, no additional parts are required. By this feature also, the semiconductor device 10 can be produced easily and economically. Further, by using the electrode members 17 as external connection terminals, a plurality of semiconductor devices can be stacked as described later.

Figure 3:
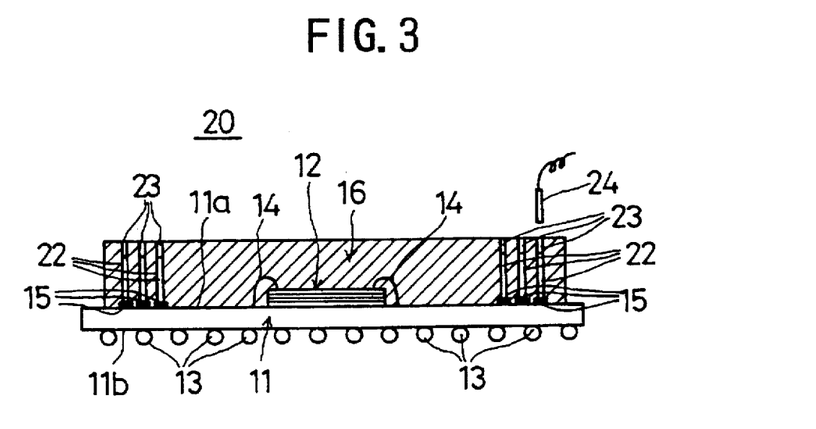
FIG. 3 is a sectional view showing a semiconductor device of a second embodiment of the present invention.

FIG. 3 is a sectional view showing a semiconductor device 20 of a second embodiment of the present invention. In the following embodiments, the same features as those previously described with reference to FIG. 2 are denoted by the same reference numerals and descriptions thereof are omitted.

The semiconductor device 20 shown in FIG. 3 is characterized in that electrode members 22 replace the electrode members 17 of the first embodiment of the present invention, whereby upper ends of the electrode members 22 are positioned in holes 23 formed in the sealing resin 16. That is, in the semiconductor device 20, the upper ends of the electrode members 22, which are electrically conductive metallic pins, do not protrude from the sealing resin 16 but are positioned in the holes 23 formed in the sealing resin 16.

As described above, in order to position the upper ends of the electrode members 22 in the holes 23, the sealing resin 16 is molded so as that the electrode members 22 protrude from the seal resin 16 as shown in the first embodiment. Next, an etching treatment is conducted on the electrode members 22 to remove a predetermined amount (which corresponds to a depth of the hole 23) of the electrode members 22.

Also, after a half-etching treatment is conducted on the electrode members 22 and the sealing resin 16 is molded, the electrode members 22 can be cut at which the half etching is conducted. As the electrode members 22 are etched by the half-etching process, the electrode members 22 can be cut easily by being bent or being pulled strongly. The holes 23 are formed by removing cut portions of the electrode members 22.

In order to make an electrical connection with an outer terminal for the semiconductor device 20, an electrode pin 24 shown in FIG. 3 can be inserted into any of the holes 23 and be connected to the electrode member 22.

Accordingly, in the semiconductor device 20 having such a structure, since the upper ends of the electrode members 22 are positioned in the holes 23 and do not protrude from the sealing resin 16, the electrode members 22 are not changed in shape even when an outer stress is applied to the semiconductor device 20. Accordingly a reliability of the semiconductor device 20 can be further improved as compared with the semiconductor device 10 of the first embodiment. Also, when a plurality of semiconductor devices 20 are stacked to constitute a semiconductor device unit as described later, the holes 23 can be utilized as positioning holes.

Figure 4:
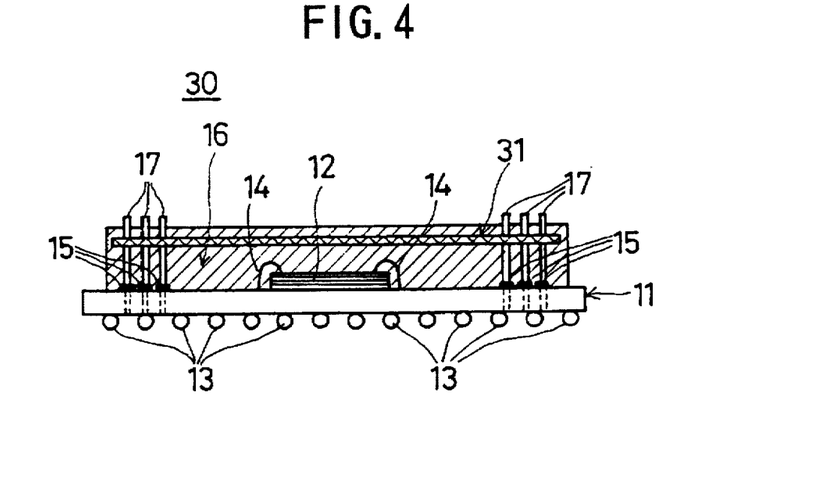
FIG. 4 is a sectional view showing a semiconductor device of a third embodiment of the present invention.

FIG. 4 is a sectional view showing a semiconductor device 30 of a third embodiment of the present invention.

In the semiconductor device 30 of this embodiment, an intermediate plate 31, which is a second base, is provided in the sealing resin 16. The intermediate plate 31 is supported by the electrode members 17 and is electrically connected to the electrode members 17. The electrode members 17 pass through the sealing resin 16 and the intermediate plate 31 to protrude from the sealing resin 16.

Figure 5:
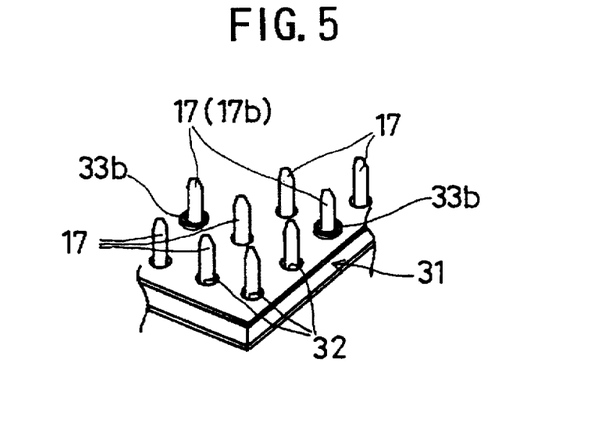
FIG. 5 is an enlarged perspective view of an intermediate plate.
Figure 6:
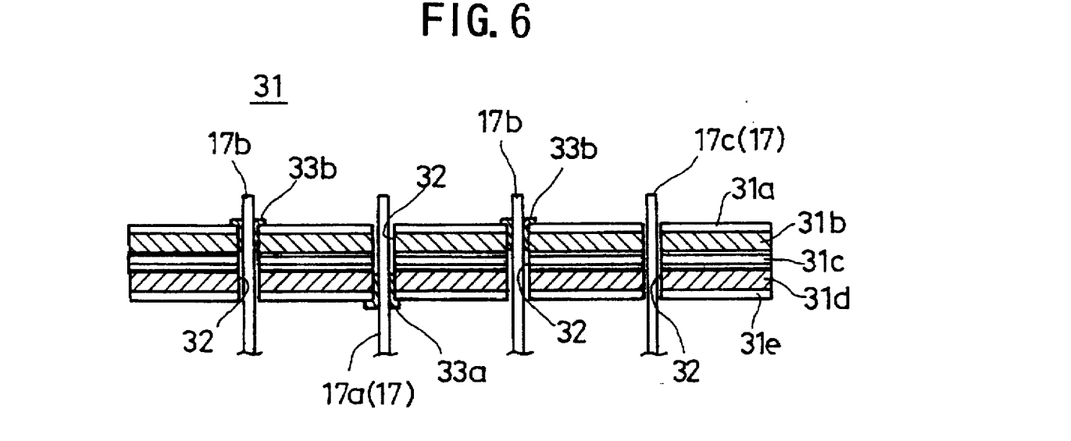
FIG. 6 is an enlarged sectional view of the intermediate plate.

FIG. 5 is an enlarged view showing an upper surface of the intermediate plate 31, and FIG. 6 is an enlarged sectional view of the intermediate plate 31. As shown in FIG. 6, the intermediate plate 31 is a multilayered base in which a first electrode pattern layer 31a, a first baseboard 31b, an adhesive layer 31c, a second baseboard 31d and a second electrode pattern layer 31e are stacked sequentially.

In the intermediate plate 31, the first electrode pattern layer 31a functions as a ground plane (hereinafter, referred to as a ground plane 31a), and the second electrode pattern 31e functions as an electric source plane (hereinafter, referred as an electric source plane 31e). The first baseboard 31b and second baseboard 31d are, for example, glass-epoxy resin baseboards, which function as insulators or supplemental members for the intermediate plate 31 to maintain a predetermined mechanical strength.

The ground plane 31a is printed on the first baseboard 31b, and the electric source plane 31e is printed on the second baseboard 31d. The adhesive layer 31c bonds with the first baseboard 31b and the second baseboard 31d to make the intermediate plate 31 a multilayered plate.

In the intermediate plate 31 having such a structure, a plurality of penetration holes 32 are formed at positions corresponding to positions at which the electrode members 17 are arranged. The electrode members 17 pass through the penetration holes 32 and extend over the intermediate plate 31 to protrude from the sealing resin 16 as described above.

Electrode pads on the semiconductor element 12, which are electrically connected to the solder balls 13 and the electrode members 17 through the wires 14, are classified as electric source pads for supplying electric power to the semiconductor element 12, ground pads for grounding, and signal pads for transmitting and receiving signals. Hereinafter, an electrode member 17 connected to an electric source pad is referred as an electric source pin 17b, an electrode member 17 connected to a ground pad is referred as a ground pin 17b and an electrode member 17 connected to a signal pad is referred as a signal pin 17c. Each pin 17a-17c is provided as shown in FIG. 6.

Each pin 17a-17c passes through the intermediate plate 31, wherein the electric source pins 17a are electrically connected to the electric plane 31e via through holes 33a (which constitute a connection portion) formed in the penetration holes 32, the ground pins 17b are electrically connected to the ground plane 31a via through holes 33b formed in the penetration holes 32, and the signal pins 17c are neither electrically connected to the ground plane 31a nor the electric source plane 31e, but simply pass through the intermediate plate 31.

In the semiconductor device 30 having such a structure, the electrode pattern can be extended by the intermediate plate 31 in addition to the printed circuit base 11, thus increasing an electrode pattern area. Also, since the intermediate plate 31 can have a wider wiring space than the printed circuit base 11 on which the semiconductor element 12 is mounted, inductance characteristics of the electrode pattern formed thereon can be improved. Accordingly, when the ground plane 31a and the electric source plane 31e which demand for low-inductance characteristics are provided on the intermediate plate 31 as shown in this embodiment, electric characteristics of the semiconductor device 30 can be improved.

In the semiconductor device 30, the electrode members 17 pass through the penetration holes 32 formed in the intermediate plate 31, and the electrode members 17 and the second base 31 are supported each other by the through holes 33a, 33b which function as connection members. Accordingly, since a position of the top end of the electrode members 17 is determined by the intermediate plate 31, the electrode members 17 are prevented from being moved by the sealing resin 16 when the sealing resin 16 is molded.

That is, in the semiconductor devices 10, 20 of the first and second embodiments having no intermediate plate 31, before the sealing resin 16 is molded, since the lower ends of the electrode members 17 are inserted into the through holes 15 and are secured in a manner like a cantilever, a shape of the upper ends can be easily changed. Accordingly, the electrode members 17 may be bent or the position of the electrode members 17 may be changed by a stress of the sealing resin 16 when the sealing resin 16 is molded.

On the contrary, in the semiconductor device 30 of this embodiment, since the intermediate plate 31 is provided near the top ends of the electrode members 17, and both the upper and lower ends of the electrode members 17 are supported. Accordingly, the above-mentioned bending of the electrode members 17 or the position change thereof does not occur after the sealing resin 16 is molded, and the positioning of the electrode members 17 can be conducted properly. Further, as the intermediated plate 31 is supported by the electrode members 17 before the molding of the sealing resin, no additional parts are required to support the intermediate plate 31 when the sealing resin is molded. Therefore, the molding of the sealing resin 16 can be conducted easily.

Figure 7:
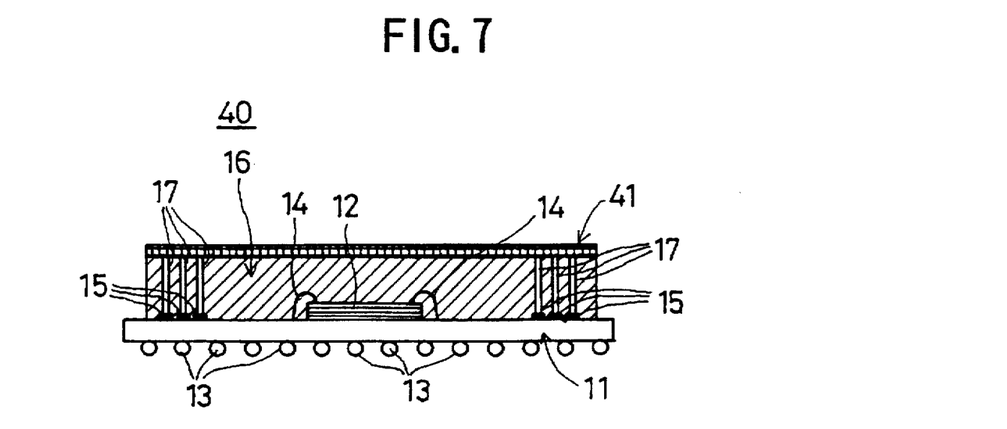
FIG. 7 a sectional view showing a semiconductor device of a fourth embodiment of the present invention.

FIG. 7 is a sectional view showing a semiconductor device 40 of a fourth embodiment of the present invention.

As shown in FIG. 7, in the semiconductor device 40 of this embodiment, a heat release member 41 for releasing heat generated by the semiconductor element 12 is provided on the sealing resin 16 and is connected to the top ends of the electrode members 17.

The heat release member 41 is a flat board made of heat-conductive metal such as copper or aluminum. The heat release member 41 is engaged to the top ends of the electrode members 17, which are supported by the heat release member 41 and the sealing resin 16.

At positions on the heat release member 41 where the electrode members 17 are engaged with, holes into which the electrode members 17 are inserted are formed. After an insulating adhesive is applied to the holes, the electrode members 17 are inserted into the holes. With an induration of the insulate adhesive, the heat release member 41 is secured on the electrode members 17.

Before the heat release member 41 is fixed to the semiconductor device 40, the semiconductor device 40 has the same structure as the semiconductor device 10 shown in the first embodiment. The upper ends of the electrode members 17 protrude from the sealing resin 16. As an insulating material is used as the heat release member 41, an insulate adhesive is not required.

In the structure described above, since the insulating adhesive is used between the heat release member 41 and the electrode members 17, the heat release member 41 is not electrically connected to the electrode members 17. The heat release members 17 are secured after a test on the semiconductor element 12 is 15 conducted by using the electrode members 17. That is, the heat release member 41 never prevents the above-mentioned test from being conducted.

In the semiconductor device 40 having such a structure, heat generated in the semiconductor element 12 is conducted not only to the sealing resin 16 but also to the heat release member 41 through the electrode members 17. Also, as the heat release member 41 is a flat board whose contacting area to the air is large, the heat generated and conducted can be released efficiently. Accordingly, the semiconductor element 12 can be cooled securely. Further, since the electrode member 17 is made of metal, a heat release efficiency can be further improved over using only the sealing resin 16.

Figure 8:
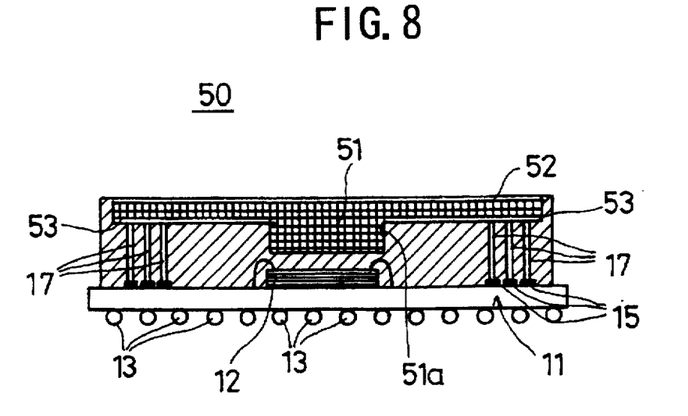
FIG. 8 is a sectional view showing a variation of the semiconductor device of the fourth embodiment of the present invention.

FIG. 8 shows a semiconductor device 50 which is a variation of the semiconductor device 40 shown in FIG. 7.

In the semiconductor device 50, a heat release member 51 has a protruding portion 51a, which faces the semiconductor element 12 and protrudes downward close to the semiconductor element 12. Also, a ground plane 52 as an electrode pattern is formed on the heat release member 51 and an electric source plane 53 is formed on a lower surface of the heat release member 51.

In this embodiment, the protruding portion 51a is formed in the heat release member 53 close to the semiconductor element 12 as described above. Therefore, a heat generated in the semiconductor element 12 can be conducted to the heat release member 51 efficiently and the semiconductor element 12 can be cooled efficiently.

Also, the ground plane 52 as an electrode pattern is formed on the upper surface of the heat release member 51, and the electric source plane 51 as a electrode pattern is formed on the lower surface of the heat release member and each plane 52, 53 is electrically connected to the electrode members 17. Therefore the heat release member 51 can function similarly to the intermediate plate 31 described in the third embodiment.

Figure 9:
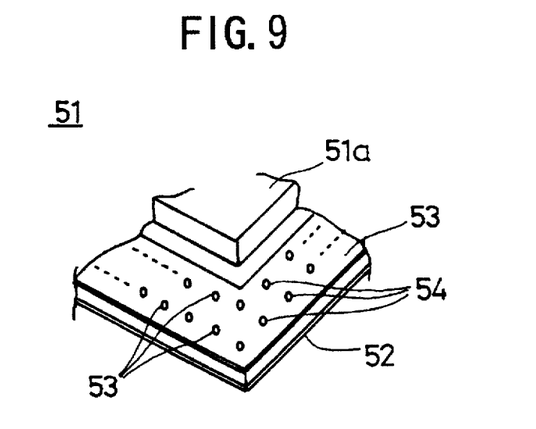
FIG. 9 is an enlarged perspective view of a heat release member.

FIG. 9 is a rear view of the heat release member 51. In the heat release member 51, except where the protruding portion 51a is provided, a plurality of penetration holes 54 are formed through which the electrode members 17 pass. On the entire upper surface of the heat release member 51, the ground plane 52 is formed. On the bottom surface of the heat release member 51, except where the protruding portion 51a is formed, the electric source plane 53 is formed.

An electrical connection between the ground plane 52 formed in the heat release member 51 and the electrode member 17 and a connection between the electric source plane 53 and the electrode member 17 can be made, for example, by providing a through hole (not shown) in the penetration hole as described above for the intermediate plate 31 of the third embodiment.

By additionally giving the heat release member 51 a function the same as for the intermediate plate 31, both a heat release efficiency and an electric efficiency can be improved. Also, a change in shape or in position of the electrode members 17 can be prevented when the sealing resin 16 is molded.

Figure 10:
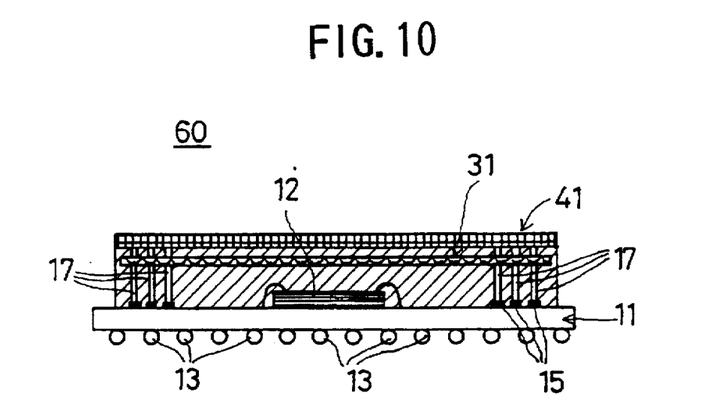
FIG. 10 is a sectional view showing a semiconductor device of a fifth embodiment of the present invention.

FIG. 10 is a sectional view showing a semiconductor device 60 of a fifth embodiment of the present invention.

The semiconductor device 60 of the fifth embodiment is characterized in that both the intermediate plate 31 (FIG. 4) provided in the semiconductor device 30 and the heat release member 41 provided in the semiconductor device 40 of the fourth embodiment are provided in one semiconductor device 60.

According to the semiconductor device 60 having such features, both a heat release efficiency and an electric efficiency can be improved in the same way as for the semiconductor device 50 shown in FIG. 8 and FIG. 9. Also, as each of the intermediate plate 31 and the heat release member 41 is independent, the position of the electrode plane in the intermediate plate 31 can be determined in spite of the position of the protruding portion 51a (FIG. 9). Further, as the semiconductor device 60 has a wider electrode plane than the semiconductor device 50 shown in FIG. 8 and FIG. 9, inductance characteristics can be improved.

Next, referring to FIGS. 11–16, embodiments of a semiconductor device unit are described.

Figure 11:
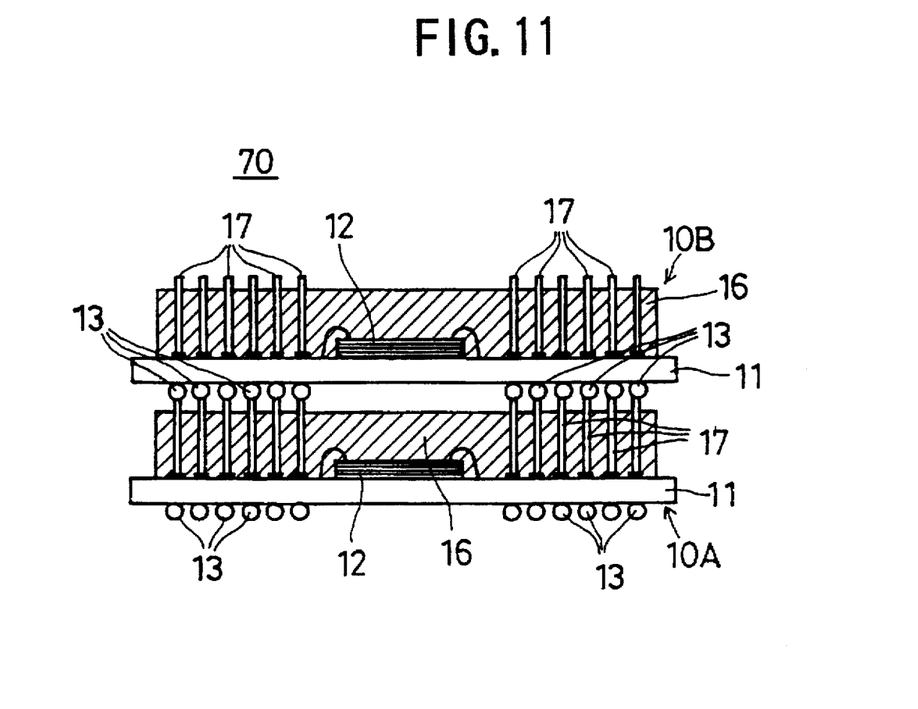
FIG. 11 is a sectional view showing a semiconductor device of a sixth embodiment of the present invention.
Figure 12:
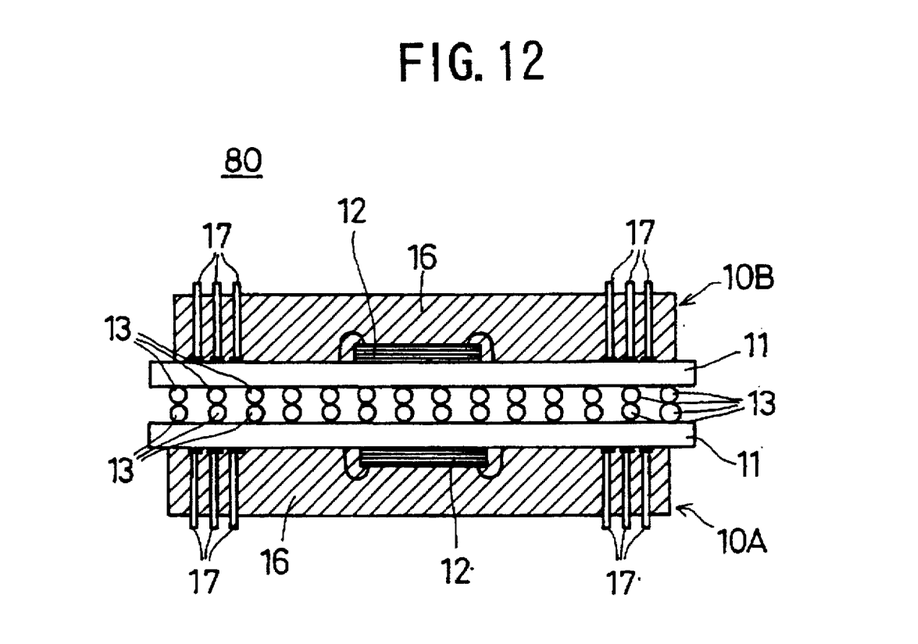
FIG. 12 is a sectional view showing a variation of the semiconductor device of the sixth embodiment of the present invention.

FIG. 11 and FIG. 12 show semiconductor device units 70, 80 of a sixth embodiment of the present invention.

The semiconductor device units 70, 80 shown in FIG. 11 and FIG. 12 are characterized in that a plurality of (in this embodiment, two) semiconductor devices described in the first embodiment are stacked.

In the semiconductor device unit 70 shown in FIG. 11, the top ends of the electrode members 17 provided in the semiconductor device 10A arranged at the bottom which protrude from the sealing resin 16 are connected to the solder balls 13 provided in the semiconductor device 10B arranged at the top in order to connect electrically the semiconductor device 10A arranged at the bottom and the semiconductor device 10B arranged at the top.

On the other hand, in the semiconductor device unit 80 shown in FIG. 12, the solder balls 13 provided in the semiconductor device 10A arranged at the bottom face the solder balls 13 provided in the semiconductor device 10B arranged at the top. When these solder balls 13 are connected, the semiconductor device 10A arranged at the bottom and the semiconductor device 10B arranged at the top are electrically connected.

In the semiconductor device 10 described in the first embodiment, since the top ends of the electrode members 17 protrude from the sealing resin 16, the protruding portions of the electrode members 17 can be used as connection terminals. Accordingly, since the protruding portions of the electrode members 17 are connection terminals on the upper surface of the semiconductor device 10 and the solder balls 13 are connection terminals on the bottom surface, a plurality of semiconductor devices can be stacked easily.

In the semiconductor device unit 70, 80 in which the semiconductor devices 10 (10A, 10B) are stacked, a plurality of semiconductor devices 10 can be arranged in an area for one semiconductor device 10 on the board in order to improve a package efficiency. Also, when the semiconductor devices 10 (10A, 10B) are stacked, various types of multilayer structures can be made.

Although it is not shown in the drawings, when the above-mentioned semiconductor devices 10A, 10B are stacked, protruding portions from the sealing resin 16 of the electrode member 17 provided in the semiconductor devices 10A, 10B can be connected in order to connect the semiconductor device 10A arranged at the bottom and the semiconductor device 10B arranged at the top.

Figure 13:
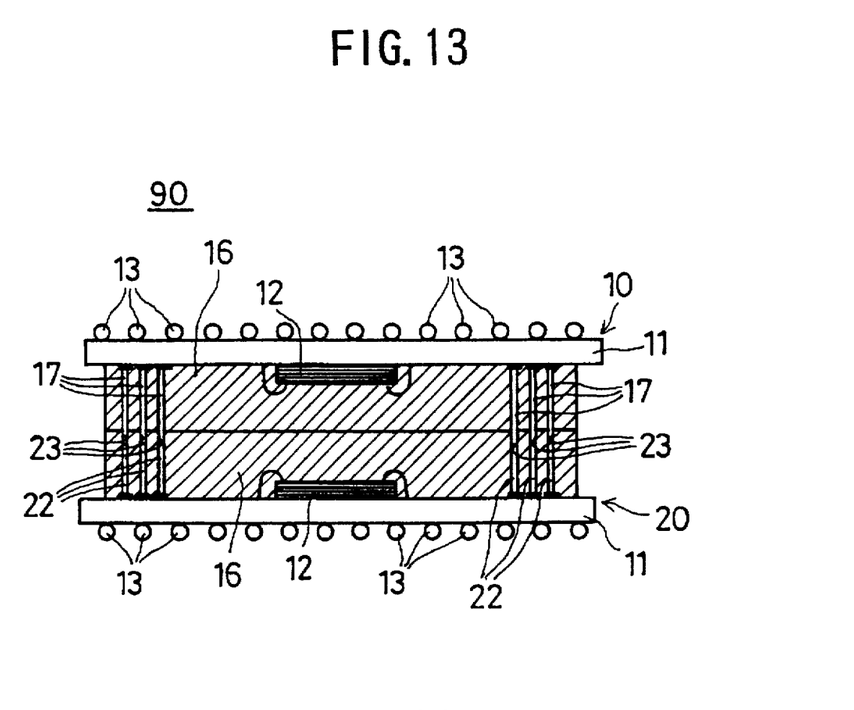
FIG. 13 is a sectional view showing a semiconductor device of a seventh embodiment of the present invention.
Figure 14:
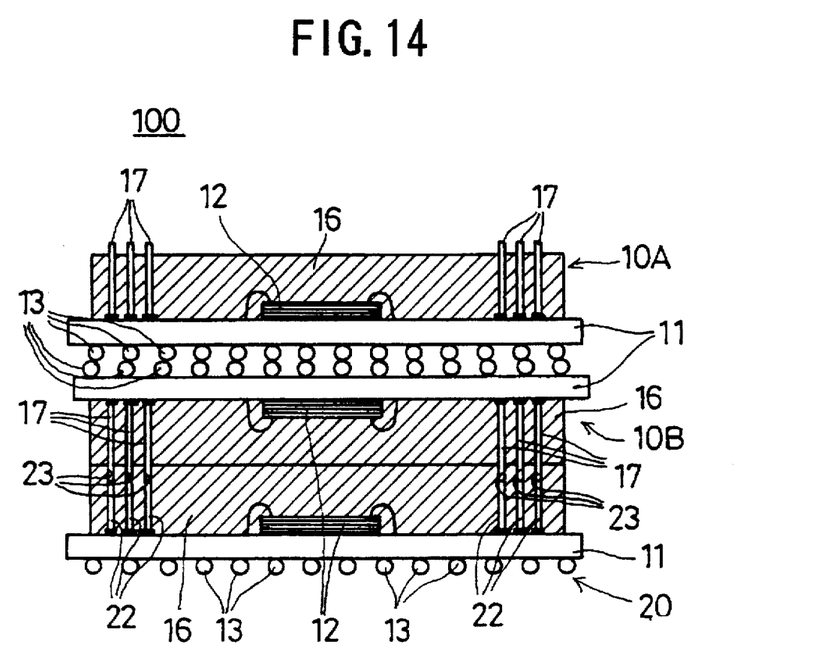
FIG. 14 is a sectional view showing a variation of the semiconductor device of the seventh embodiment of the present invention.

FIG. 13 and FIG. 14 show semiconductor device units 90, 100 of a seventh embodiment of the present invention. In the semiconductor device units 90, 100, the semiconductor device 10 described in the first embodiment and the semiconductor device 20 described in the second embodiment are stacked.

In the semiconductor device unit 90 shown in FIG. 13, protruding portions from the sealing resin 16 of the electrode members 17 are inserted into the holes 23 formed in the semiconductor device 20. When the electrode members 17 formed in the semiconductor device 10 are inserted into the holes 23 formed in the semiconductor device 20, the electrode members 17 are electrically connected to the electrode members 22 provided in the semiconductor device 20. Accordingly, when the electrode members 17 are electrically connected to the electrode members 22, the semiconductor device 10 is electrically connected to the semiconductor device 20.

As described above, in the semiconductor device unit 90, when the electrode members 17 formed in the semiconductor device 10 are inserted into the holes 23 formed in the semiconductor device 20, the position of each semiconductor device 10, 20 can be determined. Therefore, a stacking procedure can be conducted easily.

In the semiconductor device unit 100 shown in FIG. 14, the semiconductor device unit 10 is stacked on the semiconductor device unit 90 shown in FIG. 13. In FIG. 14, an electrical connection between the semiconductor device 10A arranged at the top and the semiconductor device 10B arranged in the middle is made by the connection between the solder balls 13 likewise the semiconductor device unit described in FIG. 12. As shown in the semiconductor device unit 100, the predetermined number of the semiconductor devices 10, 20 can be stacked.

Figure 15:
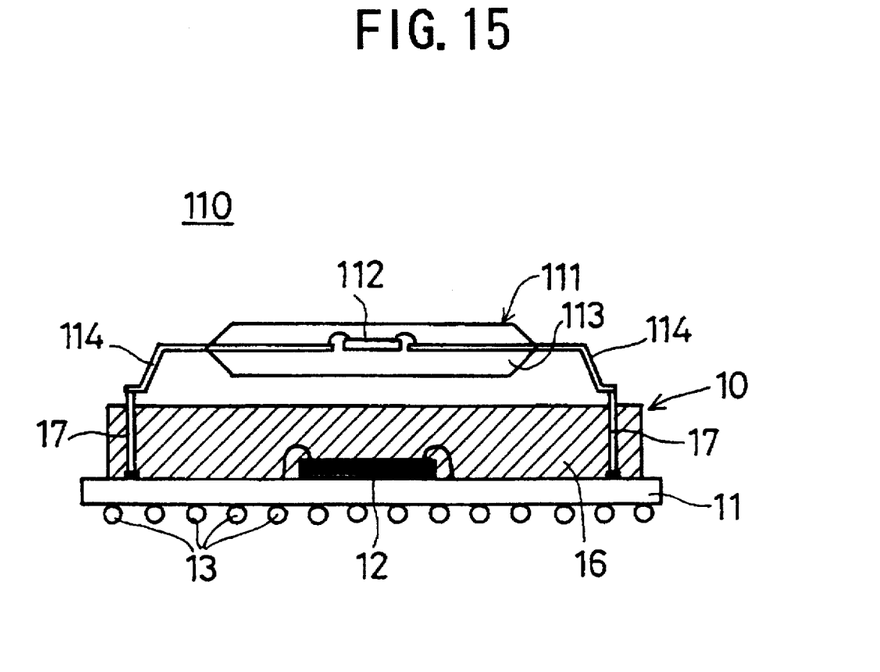
FIG. 15 is a sectional view showing a semiconductor device of an eighth embodiment of the present invention.
Figure 16:
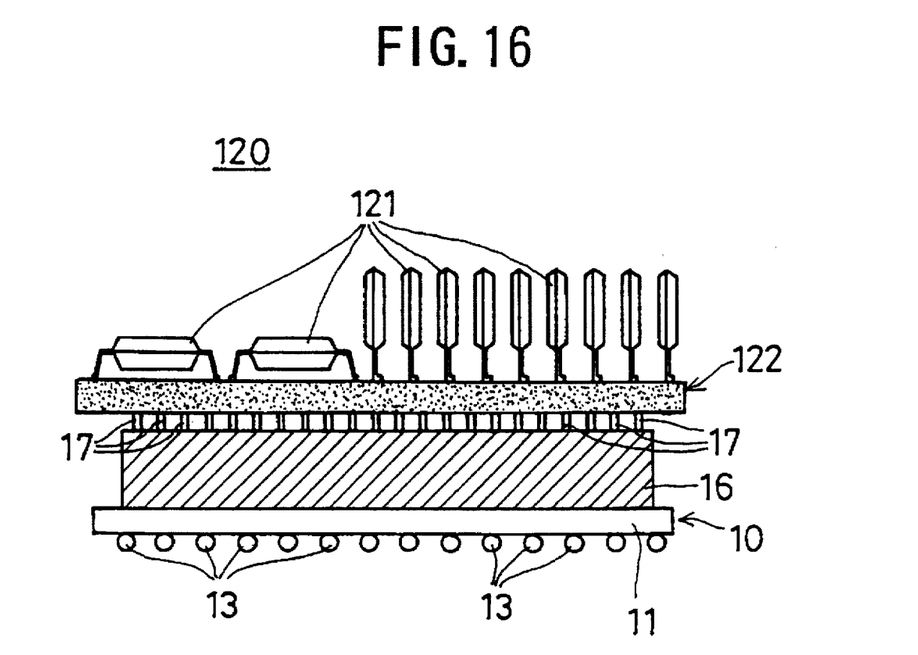
FIG. 16 is a sectional view showing a variation of the semiconductor device of the eighth embodiment of the present invention.

FIG. 15 and FIG. 16 show semiconductor device units 110, 120 of an eighth embodiment of the present invention.

In the above-described semiconductor units 70–100, a plurality of semiconductor devices, which are the semiconductor device 10 of the first embodiment and the semiconductor device 20 of the second embodiment, are stacked. However, the semiconductor devices stacked are not limited to the above-mentioned semiconductor devices 10, 20. In the semiconductor unit 110 shown in FIG. 15, a QFP (Quad Flat Package) type semiconductor device 111 is stacked on the semiconductor device 10 of the first embodiment. The semiconductor device 111 is a surface-mounting-type semiconductor device comprising a semiconductor element 112, a package resin 113 and leads of a gull-wing shape.

The position on the semiconductor device 10 of the first embodiment at which the electrode members 17 are provided corresponds to the position of the leads 114 provided on the semiconductor device 111. Due to this arrangement, a different type of semiconductor device 111 can be stacked on the semiconductor device 10 easily.

In the semiconductor device unit 120 shown in FIG. 16, a circuit board 122 on which a plurality of semiconductor devices 121 are provided is stacked on the semiconductor device 10 of the first embodiment. However, a device stacked on the semiconductor device 10 is not limited to the semiconductor device, but a circuit board 122 can be stacked to improve a package efficiency of the semiconductor unit 120.

In the above-mentioned semiconductor device units 70–120, the semiconductor device 10 of the first embodiment and the semiconductor device 20 of the second embodiment are used to constitute multilayer structures. However, it goes without saying that the semiconductor device 30 of the third embodiment can be used to constitute a semiconductor device unit of a multilayer type.

Further, the present invention is not limited to these embodiments, but variations and modifications may be made without departing from the scope of the present invention.

What is claimed is:

1. A semiconductor device, comprising:

a semiconductor element;

a base having a mounting surface and a connection surface opposite to each other, said semiconductor element being mounted on said mounting surface, a plurality of balls which function as external connection terminals being provided on said connection surface;

a sealing resin sealing said semiconductor element, said sealing resin being formed on said mounting surface of said base; and an electrode member having a first end and a second end, said first end of said electrode member being electrically connected to said semiconductor element on said mounting surface of said base, said second end of said electrode member being electrically connected to an outer terminal, said first end of said electrode member being electrically connected to and structurally independent from at least one of said plurality of balls, wherein said electrode member is an electrically conductive metal pin and said pin passes through said sealing resin formed on said mounting surface of said base, and wherein said sealing resin formed on said mounting surface of said base has a hole formed therein and said second end of said electrode member is positioned in said hole.

2. A semiconductor device, comprising:

a semiconductor element;

a base having a mounting surface and a connection surface opposite to each other, said semiconductor element being mounted on said mounting surface, a plurality of balls which function as external connection terminals being provided on said connecting surface;

a sealing resin sealing said semiconductor element, said sealing resin being formed on said mounting surface of said base;

an electrode member having a first end and a second end, said first end of said electrode member being electrically connected to said semiconductor element on said mounting surface of said base, said second end of said electrode member being electrically connected to an outer terminal, said first end of said electrode member being electrically connected to and structurally independent from at least one of said plurality of balls; and a second base having an electrode pattern formed thereon, said second base being buried in said sealing resin, said electrode member being electrically connected to said electrode pattern formed on said second base, wherein said electrode member is an electrically conductive metal pin and said pin passes through said sealing resin formed on said mounting surface of said base, and wherein said sealing resin formed on said mounting surface of said base has a hole formed therein and said second end of said electrode member is positioned in said hole.

3. A semiconductor device according to claim 2, wherein said second base has a penetration hole formed therein through which said electrode member passes, said semiconductor device further comprising a connecting portion provided in said penetration hole by which said electrode pattern is electrically connected to said electrode member and by which said second base and said electrode member support each other.

4. A semiconductor device according one of claims 1, 2 and 3 further comprising a heat release member for releasing heat generated in said semiconductor element, said heat release member being provided on an upper part of said sealing resin, said heat release member being engaged to said electrode member.

5. A semiconductor device according to claim 4, wherein said heat release member has an electrode pattern formed thereon, said electrode member being electrically connected to said electrode pattern formed on said heat release member.

6. A semiconductor device unit comprising a plurality of semiconductor devices arranged in a stacked formation, each of said semiconductor devices, comprising:
 a semiconductor element;
 a base having a mounting surface and a connection surface opposite to each other, said semiconductor element being mounted on said mounting surface, a plurality of balls which function as external connection terminals being provided on said connection surface;
 a sealing resin sealing said semiconductor element, said sealing resin being formed on said mounting surface of said base; and
 an electrode member having a first end and a second end, said first end of said electrode member being electrically connected to said semiconductor element on said mounting surface of said base, said second end of said electrode member being electrically connected to an outer terminal, said first end of said electrode member being electrically connected to and structurally independent from at least one of said plurality of balls,
wherein said electrode member is an electrically conductive metal pin and said pin passes through said sealing resin formed on said mounting surface of said base.

7. A semiconductor device unit according to claim 6, wherein said plurality of said semiconductor devices are electrically connected by one of connections, said connections including a connection between said balls and said electrode members, a connection between said balls, and a connection between said electrode members.

8. A semiconductor device unit comprising two semiconductor devices arranged in a stacked formation, each of said two semiconductor devices, comprising:
 a semiconductor element;
 a base having a mounting surface and a connection surface opposite to each other, said semiconductor element being mounted on said mounting surface, a plurality of balls which function as external connection terminals being provided on said connection surface;
 a sealing resin sealing said semiconductor element, said sealing resin being formed on said mounting surface of said base; and
 an electrode member having a first end and a second end, said first end of said electrode member being electrically connected to said semiconductor element on said mounting surface of said base, said second end of said electrode member being electrically connected to an outer terminal, said first end of said electrode member being electrically connected to and structurally independent from at least one of said plurality of balls,
wherein said sealing resin has a hole formed therein and said second end of said electrode member is positioned in said hole in one of said semiconductor devices,
wherein said electrode member is an electrically conductive metal pin and said pin passes through said sealing resin formed on said mounting surface of said base.

9. A semiconductor device unit according to claim 8, wherein said electrode member formed in one semiconductor device is inserted into a hole formed in the other semiconductor device whereby said electrode member formed in said one semiconductor device is connected to said electrode member formed in said other semiconductor device.

* * * * *